PROCESS OF MAKING TUNNEL DIODES THAT RESULTS IN A PEAK CURRENT THAT IS MAINTAINED OVER A LONG PERIOD OF TIME
Filed June 28, 1963 2 Sheets-Sheet 1

INVENTORS
JAMES H. BUTLER
DAVID DE WITT 3,291,658

PROCESS OF MAKING TUNNEL DIODES THAT RESULTS IN A PEAK CURRENT THAT IS MAINTAINED OVER A LONG PERIOD OF TIME

James H. Butler and David De Witt, Poughkeepsie, N.Y., assignors to International Business Machines Corporation, New York, N.Y., a corporation of New York Filed June 28, 1963, Ser. No. 291,430
9 Claims. (Cl. 148—179)

This invention relates to tunnel diodes, and particularly to tunnel diodes having a wide energy gap, such as gallium arsenide diodes.

Tunnel diodes in which the semiconductor material is gallium arsenside have been recognized as having many desirable features. For example, it is known that such diodes can be readily made to have a large voltage swing in the neighborhood of 1.1 volts as compared to 0.5 volt for germanium and 0.8 volt for silicon. It is also known that gallium arsenide diodes have a high ratio of peak current to valley current, i.e., in the neighborhood of 40:1 as compared to 14:1 for germanium and 6:1 for silicon. It is also known that gallium arsenide diodes have a large energy gap in the neighborhood of 1.4 electron volts as compared to 0.7 electron volt for germanium and 1.1 electron volts for silicon.

However, the utilization of gallium arsenide tunnel diodes has been limited to low bias, low current density and thus to low speed applications, because of an unfortunate characteristic known as electrical degradation. By the term "electrical degradation," it is meant that the peak current decreases with time and thus limits the useful life of the diode.

An object of the present invention is to provide a tunnel diode having improved characteristics with respect to electrical degradation.

Another object of the invention is to provide an improved gallium arsenide tunnel diode.

Another object is to provide an improved method of making a gallium arsenide tunnel diode.

The foregoing and other objects of the invention are attained in the methods and products described herein. In the methods disclosed herein, a gallium arsenide wafer is doped with an acceptor impurity to a concentration substantially above the level at which degeneracy begins. For example, the wafer may be doped with zinc to a density of about $8\times10^{19}$ zinc atoms per cubic centimeter. An alloy dot containing donor material is then placed on the gallium arsenide wafer. The alloy dot may consist of an alloy of 87 parts indium, 10 parts copper and 1 part each of selenium, tellurium and sulfur. The dot should then be thermally alloyed to the wafer, but for a time and temperature less than commonly used for alloying such dots to wafers. For the materials described, the alloying should take place for about sixty seconds at a temperature of about 500° C. in a slightly reducing atmosphere followed by cooling to about 300° C. at a rate of at least 10° C. per second. The cooling rate below about 300° C. is not critical.

The recrystallized gallium arsenide which regrows from the molten dot as it cools should be N-doped just below the level at which degeneracy appears. This level is believed to be about $2\times10^{19}$ donor atoms per cubic centimeter.

The diameter of the junction between the dot and the wafer may be controlled by conventional etching techniques. An alternative technique is described below.

The alloyed diode is then subjected to a current in the forward direction. This current is increased gradually and is interrupted intermittently for the purpose of observing the volt-ampere characteristics of the diode at low voltages. As soon as an increase in the peak current of the diode is observed, then the forward current is no longer increased but is maintained at its previous level. It will be observed, however, that the peak current continues to rise gradually. If the forward current is allowed to continue, the peak current will gradually rise to a maximum, after which degradation will set in and the peak current will gradually decrease. By stopping the forward current treatment at the proper time, the diode may be manufactured to have a peak current versus time characteristic in which the peak current increases gradually during the first half of the life of the diode (which may be several thousand hours). Thereafter, the peak current will decrease gradually. Nevertheless, the diode may have a considerable lifetime during which its peak current is maintained at a satisfactory level.

Other objects and advantages of the invention will become apparent from a consideration of the following specification and claims, taken together with the accompanying drawings.

FIGS. 1–3

Figure 1:
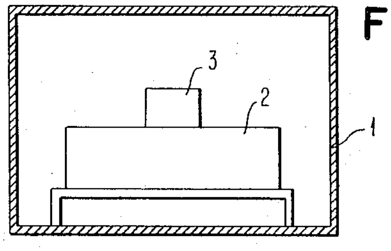
FIG. 1 is a diagrammatic illustration of the step of alloying an N-doped dot to a P-doped gallium arsenide wafer.
Figure 3:
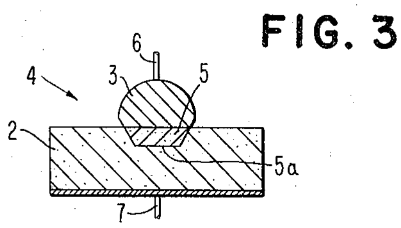
FIG. 3 is a diagramamtic representation of the diode formed in the process of FIGS. 1 and 2, with leads attached.

There is shown diagrammatically in FIG. 1 a furnace 1, enclosing a wafer 2 on the top surface of which rests a dot 3. The wafer 2 may consist of gallium arsenide doped with an acceptor type impurity such as zinc with a concentration of about $8\times10^{19}$ zince atoms per cubic centimeter. The dot may consist of an alloy of 87% indium, 10% copper, 1% selenium, 1% tellurium, 1% sulfur. All percentages are by weight. The wafer and the dot supported thereon are heated in the furnace 1 in a slightly reducing atmosphere for a period of about sixty seconds at a temperature of about 500° C. Temperatures ranging from about 500° C. to about 560° C. have been successfully used. By a slightly reducing atmosphere is meant one from which all the oxygen has been removed, and which contains an excess of a reducing agent to remove any trace of oxygen which may appear. For example, a mixture of 90% nitrogen and 10% hydrogen, would be satisfactory as a slightly reducing atmosphere.

During the heat treatment, the dot 3 and the adjacent portion of the wafer 2 melt, and the donor impurities from the dot become mixed with the molten gallium arsenide of the wafer. During the cooling, the molten material recrystallizes, regrowing the single crystal structure of the gallium arsenide wafer. The regrown region is shown at 5 in the drawing and includes a high concentration of donor impurities. This concentration should be just below the level at which degeneracy appears, which is believed to be about $2\times10^{19}$ donor atoms per cubic centimeter. A PN junction *5a* is formed between the recrystallized region 5 and the original wafer material.

The diode 4 is then mounted on a suitable base and leads 6 and 7 are attached, as by soldering. Lead 6 is attached to the dot 3 and lead 7 is attached to the side of the wafer 2 remote from the dot 3.

The diode 4 is then placed in an electrochemical etching solution, which may be of any suitable known composition and which is employed to etch the junction between the recrystallized N-region 5 and the wafer 2 to the desired diameter.

This etching operation is also intended to remove surface bridging material about the PN junction, which might otherwise short circuit the junction.

For example, a diode of the materials disclosed above may be suitably etched by immersion for ten to twenty seconds in a dilute (about 10 N) solution of potassium hydroxide. The diode 4 is allowed to remain in the etching solution until the diameter of the junction between the dot and the wafer reaches the desired dimension. For example, a diameter of 0.001" may be required.

FIG. 4

This figure illustrates an electrical circuit including a battery 13 having a positive terminal connected to the wafer 2 and its negative terminal connected through a variable resistor 8 and a switch 9 to the dot 3. The switch 9 is shown as a mechanical switch for purposes of illustration only. In any practical circuit, it would be replaced by an equivalent electronic switch. It is shown as a double-throw switch shiftable between a full line position in which the circuit just described is completed and current flows in the forward direction through the diode 4 from the battery 13 and a dotted line position shown, in the drawing, in which another circuit is completed which sends through the diode 4 current from a power supply 10 of a curve tracer 10*a*. The power supply may suitably provide full wave rectified current from a conventional commercial source. Alternatively, a sawtooth wave generator may be used. This circuit may be traced from power supply 10 through a resistor 11, the diode 4 and switch 9 back to the opposite terminal of power supply 10. One set of leads of an oscilloscope 12 is connected to the terminals of resistor 11. Another set of leads of the oscilloscope 12 is connected across the terminals of the diode 4.

The switch 9 is operated at a frequency of about 100 kilocycles and with a duty cycle of about 9 or 10:1. In other words, the switch is closed in its full line position for about $1/10$ of each cycle. During the other $9/10$ of the cycle, the circuit is closed through the voltage source 10 of the curve tracer 10*a* at which time the characteristic of the diode 4 is observed in the oscilloscope.

Figure 5:
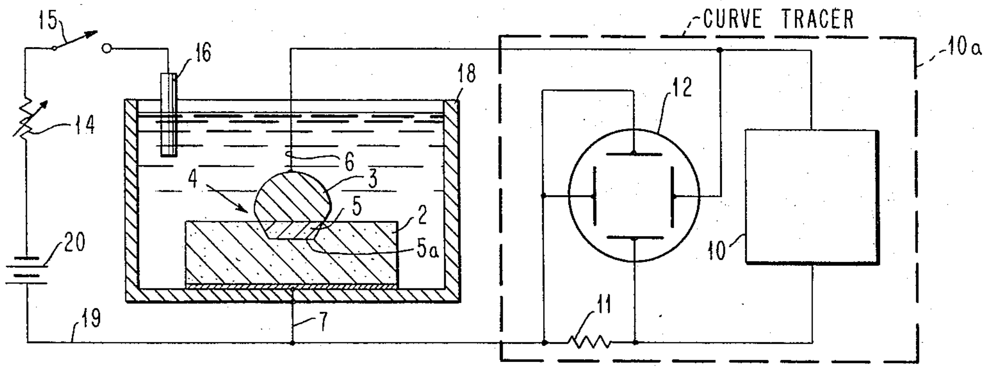
FIG. 5 is a diagrammatic illustration of an etching operation on the diode of FIG. 4.
Figures 6, 7:
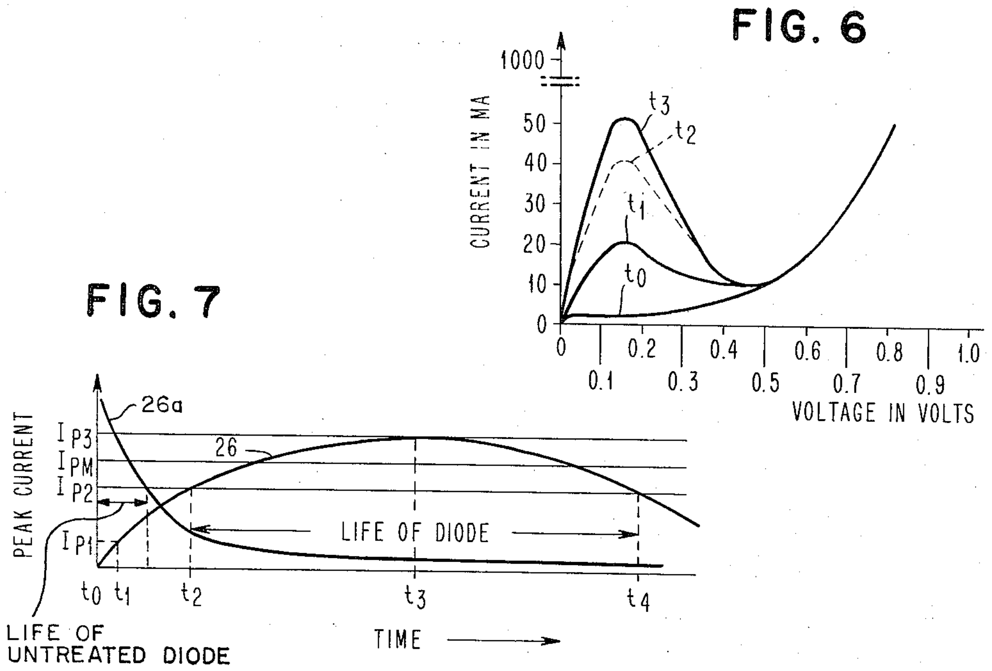
FIG. 6 is a graphical illustration of variations in the characteristics of the diode during the electrical enhancement step performed by the circuit of FIG. 5
FIG. 7 is a graphical illustration of the variation in peak current with time for a diode treated by the technique of the present invention and for a diode fabricated conventionally.

FIG. 6 illustrates the variation in the volt-ampere characteristic of the diode 4 during the electrical treatment by the apparatus shown in FIG. 5. When the treatment starts, the volt-ampere characteristic of a diode manufactured in accordance with the process of FIGS. 1 to 4 appears substantially as shown at $t_0$ in FIG. 6. It will be observed that this characteristic has no positive peak, but is simply flat where a positive peak would appear in a tunnel diode characteristic. The current through the diode from battery 13 is initially started at a low value by setting the variable resistor 8 at a high value and the resistance is reduced to gradually increase the current until an increase in the peak current appears in the oscilloscope. In other words, the resistance of resistor 8 is gradually reduced until a substantial positive peak appears in the characteristic such as that illustrated in $t_1$ in FIG. 6. At that time, the variation of the resistor 8 is terminated, but the process is allowed to continue. As the process continues, the peak current in the characteristic will continue to increase. The variation of the peak current with time is illustrated in FIG. 7. As time increases from $t_0$, the peak current varies along the curve 26 and at time $t_1$ has the value of $I_{p1}$. At some time $t_2$, the peak current will have increased to a value $I_{p2}$, at which time it is con venient to start the useful life of the diode. In the typical manufacturing operation, the treatment of the diode in the circuit of FIG. 5 will stop at that point.

Figure 4:
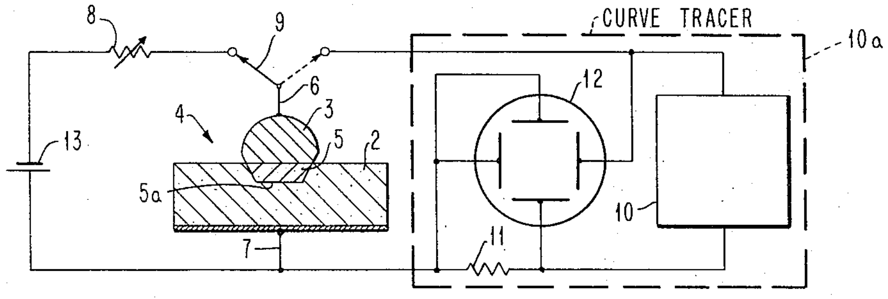
FIG. 4 is a wiring diagram of a circuit used in electrically enhancing the peak current of the diode formed in FIGS. 1 to 3.

If the treatment of the diode with forward current is continued in the circuit of FIG. 4 beyond the time $t_2$, then the peak current will gradually increase, reaching a maximum value $I_{p3}$ at a time $t_3$. Thereafter, the peak current will decrease, until at time $t_4$, it has decreased to the same value it had at time $t_2$. The useful life of the diode is thus between times $t_2$ and $t_4$. This time may extend typically over a period of 20,000 hours. The variation of the peak current from $I_{p2}$ to $I_{p3}$ may be plus or minus 2% of the median value $I_{pm}$.

In contrast with the curve 26 depicting the variation of peak current with time for a diode which has been treated as described immediately above, curve 26*a* shows the serious degradation in peak current with time for a conventionally fabricated diode.

For a specific application, it is usually desirable to treat the diode coming from the process of FIG. 4 to a further etching operation as shown in FIG. 5, wherein the area of the junction is further reduced by etching to get a desired value of peak current.

In the circuit of FIG. 5 current flows from a battery 20 through a resistor 14 and a switch 15 and thence through an electrode 16, an etching solution 17 and diode 4 to a tank 18 containing the etching solution and thence through a wire 19 back to the battery 20. The tunnel diode characteristic is observed by means of a curve tracer 10*a* and consists of sending current from power supply 10 through a resistor 11, through lead 7 to the diode and thence back to the voltage source by means of lead 6. The terminals of the resistor 11 are connected to one set of leads of an oscilloscope 12. The other set of leads of the oscilloscope are connected across the terminals of the diode 4. By opening switch 15, the volt-ampere characteristic of the diode may be observed so that the diode may be removed from the solution when its peak current reaches the desired value.

While in FIG. 4, the process of increasing the peak current of the diode has been described above as taking place with the forward current held at a constant value, it should be understood that the forward current need not necessarily be held constant, but may be increased somewhat after the peak current starts to increase. Alternatively, the forward currents may in some cases be decreased after the peak current starts to increase. It is only necessary that the forward current be held within a range which will keep the peak current increasing. Typically, such a current is very heavy as compared to the actual peak current. For example, a forward current of 1,000 milliamperes may be required to bring about the desired increase in the peak current of a diode whose maximum peak current is about 50 milliamperes.

The upper limit of the forward current used during this process is determined either by the generation of heat in quantities which may destroy the diode or by the required speed of the monitoring cycle. The lower limit of that current is determined by a slowing down of the process to a point where is becomes uneconomic. The value indicated above, namely the current at which an increase in the peak of the characteristic is first noted, has been found to be a practical compromise for a system where the current flow is controlled manually as a result of visual observations of current measurements.

It is necessary that the N-doping of the recrystallized N-region start with a substantially lower concentration than the P-doping of the wafer 2. As mentioned above, it is usually desirable to start the wafer with a P-doping of about $8\times10^{19}$ atoms per cubic centimeter. The dot is started with an N-doping of about $1.5\times10^{19}$, or just below the lower limit for the threshold of degeneracy which is about $2\times10^{19}$. During the electrical treatment described above, the N-doping in the dot is increased, at least in the region closely adjacent to the PN junction 5*a* and the P-doping in the wafer is decreased, at least in the region closely adjacent to the PN junction 5*a*. At the termination of electrical treatment process, the P-doped wafer still remains more heavily doped than the recrystallized N region 5, having a concentration of about $4\times10^{19}$ while the concentration in the N-region 5 is then about $3\times10^{19}$.

It may be pointed out that in the conventional manufacture of tunnel diodes, it has been thought desirable to try and make the doping even on both sides of the junction. This condition has been described by the term "symmetrical doping." It is believed that during the electrical treatment described above, some of the atoms on one side or the other of the junction actually migrate through the junction. It is considered that in order for the process to work satisfactorily, the particular atoms which cross the junction must be present in sufficient concentration, presently believed to be greater than $10^{18}$ atoms per cubic centimeter.

The following is a theoretical explanation of the physical phenomenon observed during the electrical treatment described above, by which the peak current is increased. This theory is as yet unconfirmed in many of its details and the applicants do not consider that their invention should be bound by this particular theory. It is presented simply as an aid to the understanding of the invention.

The relationship between peak current $I_p$ and junction width W may be expressed by the following equation:

$$I_p \alpha \exp(-kW) \quad (1)$$

The relationship between the junction width W and the concentration *n* of uncompensated donor atoms per cubic centimeter on the N-side of the junction and the concentration *p* of uncompensated acceptor atoms per cubic centimeter on the P-side of the junction, may be expressed by the following equation:

$$W a (n+p/np)^{1/2} \quad (2)$$

Assume that a certain percentage of the donor atoms are initially compensated by impurity acceptor atoms. In the example given, the selenium, tellurium and sulfur atoms act as donors and the impurity acceptor atoms may be copper. Under proper conditions such as the high current treatment described above, some copper atoms may be activated to a higher energy state where they become donor atoms and acquire a higher velocity of diffusion, also leaving donor atoms uncompensated. A certain percentage of these copper atoms will reach the junction and be swept across under the influence of the electrical field at the junction. As donors on the P-side of the junction, these copper atoms will form stable ion pairs with the acceptor atoms located there. There consequently results an increase in *n* and a decrease in *p*. When p is initially greater than *n*, the operation is effective to decrease the junction width. On the other hand, when *n* is greater than *p*, the effect is to increase the junction width.

As pointed out above, it is desired to stop the electrical treatment at the time $t_2$, at which time *p* is still greater than *n*. It is considered that during the life of the diode, *n* and *p* become equal at about the time $t_3$, when the peak current is maximum. Thereafter, the further flow of current through the diode gradually increases the junction width.

The invention is useful in connection with other diodes which exhibit the degradation phenomenon illustrated in FIG. 7, and in which one region is more heavily doped than the other.

FIGS. 8–11

These figures illustrate a modification of the process described above with respect to the manner of controlling the diameter of the junction between the dot and the wafer.

Figure 8:
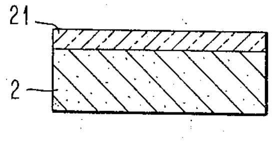
FIGS. 8 to 11 are diagrammatic illustrations of an alternative process which may be used in place of the process of FIGS. 1 to 4.
Figure 9:
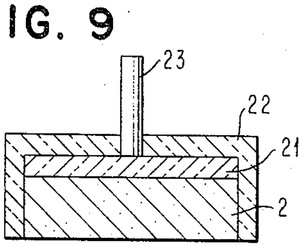

In FIG. 8, a wafer 2, which may be the same as the wafer 2 of FIG. 1, is covered with a coating of insulating material. This may be a layer of silicon dioxide deposited pyrolytically in a furnace, as shown at 21 in FIG. 8. Over the $SiO_2$ layer is deposited a layer of glass. For the purposes of the present discussion, these two layers may be considered as one, and both layers as part of the layer 21 shown in the drawing.

Figure 2:
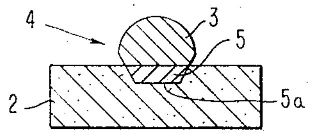
FIG. 2 is a diagrammatic representation of the rapid cooling step which follows the step of FIG. 1.
Figure 10:
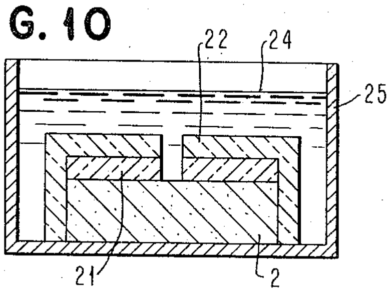

The wafer 2, with its insulating coating 21, is then covered with a coating 22 of material resistant to the action of a chemical etching solution. This coating covers the wafer 2 and its insulating coating 21 except at one point where a rod 23 is placed in contact with the coating 21 to prevent the coating 22 from covering it. Alternatively, a photo-sensitive resist process can be employed. The coated wafer 2 is then placed in an etching solution 24 in a tank 25, as shown in FIG. 10. A succession of etchants in a succession of tanks may be required. The solution or solutions should be selected so as to dissolve both the rod 23 and the coating 21 but not the resistant coating 22. The etching solution effectively drills a small hole through insulation 21 having a diameter substantially the same as the diameter of the rod 23. A dot 3 containing donor material is then placed on top of the insulation coating 21 over the hole formed therein by the etching process of FIG. 10 and the alloying then proceeds as illustrated in FIGS. 1 and 2.

Figure 11:
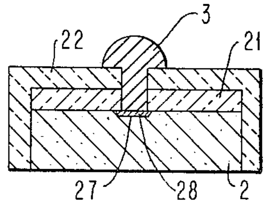

The completed diode is shown in FIG. 11 and has a PN junction 27 formed at the interface between the original material of the wafer 2 and a recrystallized region 28 similar to the recrystallized region 5 in the modification of FIGS. 1 to 5. The diode of FIG. 11 is then subjected to an electrical enhancement treatment such as that illustrated in FIG. 4.

The diameter of the PN junction 27 is controlled by the proces of FIG. 10 so that the etching processes described above, including that of FIG. 5, are no longer necessary. Thus, it is no longer necessary individually to etch each diode in order to obtain the desired peak curent (a time consuming process). Secondly, the elimination of these etching processes at the junction eliminates the danger of post-etching of device due to insufficient rinsing, thus increasing the stability of the diode over life.

While we have shown and described certain preferred embodiments of our invention, other modifications thereof will readily occur to those skilled in the art, and we therefore intend our invention to be limited only by the appended claims.

We claim:

1. The process of increasing the peak current at a given operating temperature for a tunnel diode, comprising the steps of:
   - (a) forming a junction defined by two regions, the first region having a doping concentration substantially above the level of degeneracy and the other region having a doping concentration no greater than that at the level of degeneracy;
   - (b) passing a current, substantially in excess of the peak curent, in the forward direction through the diode at said given operating temperature;
   - (c) measuring the current-voltage characteristic of the diode; and
   - (d) increasing the forward current until there is an increase in the peak current in said characteristic at said given operating temperature.

2. The process of making a tunnel diode to increase the peak current at a given operating temperature comprising the steps of:
   - (a) alloying a dot of material containing n-type impurity into a gallium arsenide wafer doped with p-type impurity to a doping concentration substantially above the level of degeneracy to produce an alloyed diode in which the recrystallized N-region is doped with a concentration no greater than that at the level of degeneracy;

(b) passing a current, substantially in excess of the peak current, in the forward direction through said alloyed diode at said given operating temperature.

(c) measuring the current-voltage characteristic of said junction at low voltages; and (d) increasing the forward current until there is an increase in the peak current in said characteristic at said given operating temperature.

3. The process of claim 2, in which the gallium arsenide wafer is doped with zinc to a concentration of about $8 \times 10^{19}$ zinc atoms per cubic centimeter.

4. The process of claim 2, in which the recrystallized P-region is doped to a concentration of about $1.5 \times 10^{19}$ donor atoms per cubic centimeter.

5. The process of claim 2, in which the alloying step is carried on for about sixty seconds at a temperature of about 500° C.

6. The process of claim 5, in which the alloying at 500° C. is followed by cooling the dot-wafer junction to less than 300° C. at a rate of at least 10° C. per second.

7. The process of claim 2, in which the junction between the dot and the wafer is etched to a given diameter before the forward current is applied to the diode.

8. The process of claim 2, in which the dot-wafer junction is etched to obtain a predetermined peak current after the forward current is applied to the diode.

9. The process of claim 2, comprising the further initial steps of:

(a) coating the doped gallium arsenide wafer with an insulating film;

(b) covering the insulating film with a layer resistant to a chemical etching solution, leaving an opening in the layer the same size as the desired junction diameter; and (c) immersing the resistant-layer-covered diode in the etching solution until the solution etches a hole through the insulating film; and (d) placing the dot over the hole in the film and then proceeding with the alloying step (a) of claim 4.

References Cited by the Examiner

UNITED STATES PATENTS

| | | | |
|---|---|---|---|
| 2,825,667 | 3/1958 | Mueller | 148—1.5 |
| 3,025,589 | 3/1962 | Horeni | 29—25.3 |
| 3,030,557 | 4/1962 | Dermit | 317—234 |
| 3,033,714 | 5/1962 | Ezaki | 148—33 |
| 3,079,512 | 2/1963 | Rutz | 307—88.5 |
| 3,110,849 | 11/1963 | Soltys | 317—237 |
| 3,150,021 | 9/1964 | Lota | 156—17 |
| 3,156,592 | 11/1964 | Zuleeg | 148—183 |
| 3,160,534 | 12/1964 | Oroshnick | 148—177 |
| 3,171,042 | 2/1965 | Matare | 307—88.5 |
| 3,173,814 | 3/1965 | Law | 148—175 |
| 3,187,193 | 6/1965 | Rappaport | 307—88.5 |
| 3,237,064 | 2/1966 | Tiemann | 317—234 |
| 3,245,847 | 3/1966 | Pizzarello | 148—177 |

JOHN W. HUCKERT, *Primary Examiner.*

M. EDLOW, *Assistant Examiner.*